United States Patent
Robinson

(10) Patent No.: US 9,832,590 B2
(45) Date of Patent: Nov. 28, 2017

(54) AUDIO PROGRAM PLAYBACK CALIBRATION BASED ON CONTENT CREATION ENVIRONMENT

(71) Applicant: Dolby Laboratories Licensing Corporation, San Francisco, CA (US)

(72) Inventor: Charles Q. Robinson, Piedmont, CA (US)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 0 days.

(21) Appl. No.: 15/260,050

(22) Filed: Sep. 8, 2016

(65) Prior Publication Data

US 2017/0078823 A1  Mar. 16, 2017

Related U.S. Application Data

(60) Provisional application No. 62/217,871, filed on Sep. 12, 2015.

(51) Int. Cl.
| | |
|---|---|
| H03G 5/00 | (2006.01) |
| H04S 7/00 | (2006.01) |
| H04R 3/04 | (2006.01) |
| H03G 5/16 | (2006.01) |
| H03G 7/00 | (2006.01) |
| H03G 5/02 | (2006.01) |
| H04R 27/00 | (2006.01) |

(52) U.S. Cl.
CPC ............. *H04S 7/307* (2013.01); *H03G 5/025* (2013.01); *H03G 5/165* (2013.01); *H03G 7/00* (2013.01); *H04R 3/04* (2013.01); *H04R 27/00* (2013.01); *H04S 7/305* (2013.01); *H04S 2400/01* (2013.01); *H04S 2400/13* (2013.01)

(58) Field of Classification Search
CPC .. H04S 7/307; H04S 2400/01; H04S 2400/13; H04R 3/04; H04R 25/48; H04R 25/558; H03G 5/165; H03G 5/025; H03G 7/00
USPC .................................................. 381/102–103
See application file for complete search history.

(56) References Cited

U.S. PATENT DOCUMENTS

| | | | | |
|---|---|---|---|---|
| 8,744,247 | B2 * | 6/2014 | Crockett | ................. G10L 21/02 386/285 |
| 9,622,009 | B2 * | 4/2017 | Robinson | ................. H04S 3/008 |
| 2005/0251273 | A1 | 11/2005 | Bychowsky | |
| 2008/0002839 | A1 | 1/2008 | Eng | |

(Continued)

FOREIGN PATENT DOCUMENTS

| | | |
|---|---|---|
| WO | 01/26220 | 4/2001 |
| WO | 2012/013858 | 2/2012 |
| WO | 2014/083569 | 6/2014 |

*Primary Examiner* — Disler Paul

(57) ABSTRACT

Embodiments are described for a method of rendering an audio program by receiving, in a renderer of a playback system, the audio program and a target response representing desired characteristics of the playback environment, deriving a playback environment response based on characteristics of the playback environment, comparing the target response to the playback environment response to generate a set of correction settings, and applying the correction settings to the audio program so that the audio program is rendered according to the characteristics of the target response. The target response may be based on audio characteristics in a creation environment.

19 Claims, 6 Drawing Sheets

(56) References Cited

U.S. PATENT DOCUMENTS

| | | |
|---|---|---|
| 2008/0175411 A1 | 7/2008 | Greve |
| 2009/0047993 A1 | 2/2009 | Vasa |
| 2009/0226152 A1 | 9/2009 | Hanes |
| 2012/0328115 A1* | 12/2012 | Wolters .................... H03G 9/00 381/57 |
| 2014/0010379 A1 | 1/2014 | Wellman |
| 2014/0050334 A1 | 2/2014 | Antonellis |
| 2014/0086416 A1* | 3/2014 | Sen ....................... G10L 19/008 381/23 |
| 2014/0119570 A1* | 5/2014 | Davis ....................... H04R 3/12 381/103 |
| 2014/0133683 A1* | 5/2014 | Robinson ................ H04S 3/008 381/303 |
| 2015/0208190 A1 | 7/2015 | Hooks |
| 2015/0263692 A1 | 9/2015 | Bush |
| 2015/0341736 A1* | 11/2015 | Peters ....................... H04S 7/30 381/17 |
| 2017/0032801 A1* | 2/2017 | Baumgarte ............. G10L 19/26 |

* cited by examiner

| PARAMETER | EXAMPLE VALUE |
|---|---|
| Max + Gain / Min – Gain | +6 dB / -6 dB |
| Frequency Range | 20 Hz to 20KHz |
| Degree of Smoothing | 1/3 Octave |
| Tolerance | +/- 1dB |

AUDIO PROGRAM PLAYBACK CALIBRATION BASED ON CONTENT CREATION ENVIRONMENT

CROSS-REFERENCE TO RELATED APPLICATION(S)

The present application claims priority to U.S. Provisional Patent Application No. 62/217,871, filed on Sep. 12, 2015, the disclosure of all of which is incorporated herein by reference in its entirety.

FIELD OF THE INVENTION

One or more implementations relate generally to audio equalization, and more specifically to calibrating the playback of audio programs based on content creation settings.

COPYRIGHT NOTICE

A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

The use of equalization for audio recordings has been common practice for many years. Historically, equalization has been applied symmetrically prior to transmission and after reception, and is used to condition the signal based on the characteristics of the transmission media. Standardized calibration is often provided for playback of a given media type (e.g., vinyl records and magnetic tape media). The specified calibration may indicate fixed processing to be applied (e.g., frequency dependent gain), or a target response to be achieved (e.g., net frequency response of entire playback system).

Different transmission or storage media impose different equalization requirements. For example, on vinyl records, low frequencies are generally difficult to recover and inefficient to transmit and high frequency noise can be introduced during playback. For audio distribution on vinyl phonograph records, an industry standard RIAA (Recording Industry Association of America) playback equalization scheme was established in the mid-1950s to standardize the hundreds of different equalization schemes that the individual record companies were using. FIG. 1A illustrates a plot of the RIAA playback equalization scheme as generally known in the art. To mitigate the possible low frequency attenuation and high frequency noise of vinyl records, equalization (EQ) is applied prior to transfer to vinyl (pre-emphasis curve 102) and the symmetric/opposite EQ is applied after recover of the audio signal from the vinyl record (de-emphasis curve 104). This EQ is standardized for all modern vinyl recording and reproduction devices, and the specified frequency dependent gains are applied universally by the recording and playback devices.

Similar to vinyl records, reproduction issues arise with recording to audio cassette tapes. Again, equalization (EQ) is applied prior to transfer to tape (pre-emphasis) and the symmetric/opposite EQ is applied after recover of the audio signal from the tape (de-emphasis). For cassette tapes, the optimal EQ depends on the chemical formulation of the tape, typically Fe—Cr, $CrO_2$, metal, or normal ($Fe_2O_3$). As a result, several standards for EQ exist and are engaged based on the type of tape used, such as through a mechanical tab on the tape that actuates a switch on the playback device.

With regard to cinema applications, the need for standardized frequency response for movie audio playback was recognized from the early days of sound-on-film. In the case of cinema, the need for EQ (non-flat frequency response) is a function many parameters including of the distribution format, the playback equipment, and the playback environment. The first attempt to codify the system was made by the Motion Picture Research Council (reporting to the Academy of Motion Picture Arts and Sciences) in 1937, and was based on the subjective preference for playback of typical cinema content played over typical equipment. The preferred response included significant high frequency attenuation. The "Academy Curve" was implemented as electrical filters within the "A-chain," which is the part of the audio signal path that includes transduction from media to electrical signal, and any other processing prior to audio amplifiers, of the playback equipment. Later, as more advanced and varied playback equipment was employed (especially loudspeakers), the variation in the playback response increased. In response, the ISO (International Standards Organization) attempted to specify average theater B-chain response, which is the net response due to power amplifier, loudspeaker, screen, and auditorium acoustics. This curve was intended as a reference point for mix stage design to match the sound on the mix stage with what was being heard by the audience.

More recently (over 20 years ago), technical advances allowed for a flat A-chain. As a result, there was an opportunity and necessity to redefine the target B-chain response with a flat A-chain in mind and this led to the SMPTE ST 202 standard, widely known as the X-curve. The X-curve is now the standard for playback of optical and digital cinema sound tracks, and is illustrated in a representative curve of FIG. 1B. Many cinema processors provide a "format" selector, similar to the media-type selector on cassette decks, that allows the user to select the appropriate response for playback of current films (with X-curve mastering) or older movies that were mastered with the Academy curve in circuit. It should be noted that the X-Curve is a system target response curve, which takes into account the effects of the entire playback system. Frequency dependent gain (implemented as audio filters) is applied as necessary to achieve the desired target response. This is in contrast to the equalization curves for vinyl records or cassette tapes, which specify the fixed, frequency-dependent gain that is to be applied.

In some cases, a mixing studio audio engineer, or content creator may have personal preferences for the overall frequency response of the content creation or validation environment. As stated above, standardized calibration methods for playback based on a given media type (e.g., vinyl, tape, optical film etc.) generally specify a fixed processing to be applied (e.g., frequency dependent gain), or a target response to be achieved (e.g., net frequency response of entire playback system). They do not provide a method of customizing program reproduction. Though present equalization standards may provide convenience in providing a guide that is generally acceptable, these industry standard curves generally impose a response that is not necessarily represent what the content creator heard during the creation of the program. Moreover, with respect to cinema, present equalization curves were developed for film-based use where the audio is encoded in film reels that are distributed to individual cinemas. AV content (movies, TV, streaming music, etc.) is increasingly being distributed as digital data that is transmitted over physical or wireless networks. For such transmission applications there is no standard equalization curve. Thus, audio programs transmitted for playback in non-cinema environments, and especially cinema content conforming the standard X-curve, is often not well matched to the program intended to be heard by the that was heard and approved by the content creator.

It is therefore advantageous to provide a method for matching the system response of the playback environment to that of the program creation (or validation) environment and that provides a high fidelity audio presentation that is consistent from mix stage to any playback environment.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which in and of themselves may also be inventions. Dolby, Atmos, Dolby Digital Plus, Dolby TrueHD, DD+, and Dolby Pulse are trademarks of Dolby Laboratories.

SUMMARY OF EMBODIMENTS

Embodiments are described for a method of rendering an audio program by receiving, in a renderer of a playback system, the audio program and a target response representing desired characteristics of the playback environment, deriving a playback environment response based on characteristics of the playback environment, comparing the target response to the playback environment response to generate a set of correction settings, and applying the correction settings to the audio program so that the audio program is rendered according to the characteristics of the target response. The target response may be based on audio characteristics in a creation environment.

Embodiments are further described for a method of rendering an audio program by receiving, in a renderer of a playback system, the audio program, wherein the audio program is associated with a creation environment transfer curve representing frequency response characteristics of the creation environment, deriving a playback environment transfer curve based on frequency response characteristics of the playback environment, comparing the creation environment transfer curve to the playback environment transfer curve to generate a set of correction settings, and applying the correction settings to the audio program so that the audio program is rendered according to the frequency response characteristics of the creation environment. The creation environment transfer curve represents a frequency response and overall sound pressure level corresponding to a desired sound of the audio program by a creator of the audio program based on audio characteristics in a creation environment and any added equalization settings applied by the creator. The audio program may comprise digital audio content transmitted to the renderer as a digital bitstream, and the transfer function may be transmitted as metadata encoded in the digital bitstream. Alternatively it may comprise analog data and the transfer function may be encoded as a calibration signal such as tones or a wideband audio signal. The correction settings may comprise differential gain values applied to the audio program to compensate for differences between the creation environment transfer curve and the playback environment transfer curve. The creation environment transfer curve may be described as a series of frequency response segments comprising data pairs specifying a corner frequency and differential slope.

In an embodiment, the desired audio characteristic comprises one of an objective measure based on a standard frequency response characteristic and a subjective measure based on judgment by the creator of the audio program. The audio program may comprise cinema content including audio tracks, the listening environment comprises a cinema, and the creation environment may be a mixing facility or a content authoring facility, and the creator ("content creator") may be a mixing engineer, an audio engineer, a program author, or the designer or operator of the content creation environment. In an embodiment, the renderer comprises part of a cinema processor. The transfer function further comprises one or more parameters, such as frequency range of interest, maximum/minimum gain values, match tolerance values, and smoothing factors applied to the quiescent response.

Embodiments are further directed to a method for reproducing an audio program by receiving, in a playback system an audio program containing audio characteristics of a creation environment of the audio program and a playback system reproduces the audio program by applying equalization data that compensates for different audio characteristics of the playback system and listening environment relative to the creation environment. A transfer function representing the creation environment audio characteristics may be a function of overall playback level and frequency-dependent power response function. For this embodiment, the audio program may be digital audio content and the transfer function is carried as metadata associated with the audio program during delivery to the playback system. The transfer function may be a single value mix level parameter representing a measure of a reference acoustic level in response to a defined stimulus audio signal, and the stimulus audio signal may be a broadband signal, pink noise, or a tone sweep signal, wherein the reference acoustic level is expressed as a C-weighted sound pressure level (SPL) in decibel units. For this embodiment, the equalization data comprises corner frequency pairs and differential slope data to define a system target response curve shown as a graphical plot of frequency in hertz versus playback SPL in decibels for the transfer function. The playback environment may be a cinema, in which case the frequency response curve may be a modified SMPTE ST 202 standard curve (X-curve). The frequency response curve may be applied to an entire audio program and all playback speakers during playback of the audio program. It may also be applied to an entire audio program and a subset of all playback speakers during playback of the audio program. The audio program may comprise at least in part channel-based audio and the playback system comprises a surround-sound speaker system, and the subset of all playback speakers may be specific surround speakers of a surround sound speaker array. The audio program may have a plurality of content elements, such as music, dialog, sound effects, ambient sound, and noise, and the frequency response curve may be applied to one content element of the plurality of content elements. In an alternative embodiment, the audio program may be analog audio content and the transfer function may be encoded as tone data associated with the audio program during delivery to the playback system. In an embodiment, the creation environment is a content authoring facility, a program mixing facility, or a program validation facility, and the creation of the audio program comprises creating the audio program, mixing the audio program, or validating the audio program.

Embodiments are further directed to systems and articles of manufacture that perform or embody processing commands that perform or implement the above-described method acts.

BRIEF DESCRIPTION OF THE DRAWINGS

In the following drawings like reference numbers are used to refer to like elements. Although the following figures depict various examples, the one or more implementations are not limited to the examples depicted in the figures.

DETAILED DESCRIPTION

Figure 1A:
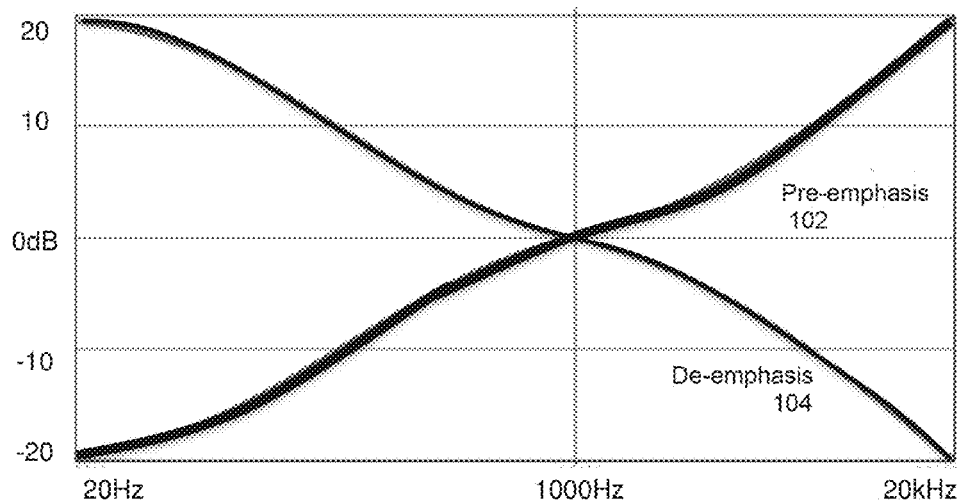
FIG. 1A illustrates a plot of the RIAA playback equalization scheme for vinyl records as generally known in the art.
Figure 1B:
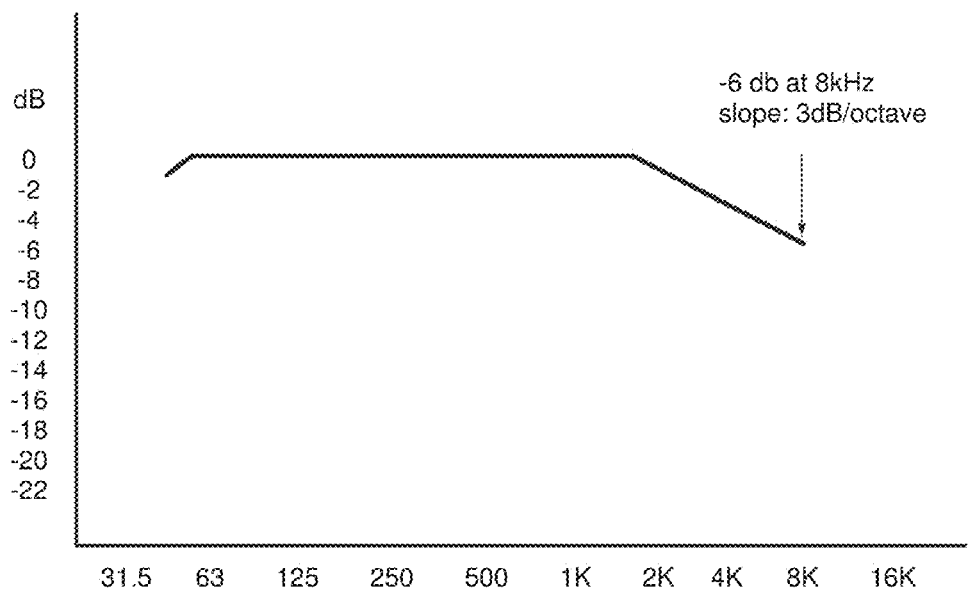
FIG. 1B illustrates a representation of the standard X-curve for playback of optical and digital cinema sound tracks.

Systems and methods are described for matching the audio signal sound level and transfer function for a playback environment to that of the program creation (or validation) environment, though embodiments are not so limited. Aspects of the one or more embodiments described herein may be implemented in an audio or audio-visual system that processes source audio information in a rendering/encoding system for transmission to a decoding/playback system, wherein both the rendering and playback systems include one or more computers or processing devices executing software instructions. Any of the described embodiments may be used alone or together with one another in any combination. Although various embodiments may have been motivated by various deficiencies with the prior art, which may be discussed or alluded to in one or more places in the specification, the embodiments do not necessarily address any of these deficiencies. In other words, different embodiments may address different deficiencies that may be discussed in the specification. Some embodiments may only partially address some deficiencies or just one deficiency that may be discussed in the specification, and some embodiments may not address all of these deficiencies.

Embodiments are directed to an audio rendering and processing system for use in an audio program authoring or creation environment including components that create a transfer function based on characteristics of the creation environment for use in calibrating the equipment in a playback environment (e.g., cinema) to match the transfer function through an EQ/tuning process, as well as a cinema processor that receives the representation of the transfer function and calibrates the equipment in the cinema to match the creation environment transfer function through the EQ/tuning process.

Embodiments are generally described in relation to cinema program content that is created or generated in one location (a "creation environment") for transferring to a cinema as the playback environment for enjoyment by an audience. It should be noted that other types of creation and playback environments are also possible, and that a creation environment refers to any location or place where audio content is authored, generated or otherwise created, and which has associated with it certain audio characteristics that influence the audio creator or engineer with regard to how the content sounds in this environment. Likewise, a playback environment refers to any location or place where the audio is played back, and that is different from the creation environment and most likely has different audio characteristics than the creation environment. In order to allow for more accurate rendering of the audio content with respect to the audio characteristics of the creation environment and what the creator heard during creation, certain processes use the creation environment characteristics to modify such as through equalization, gain control, etc.) the played back content to compensate for the differences between the creation and playback environment characteristics.

Figure 2:
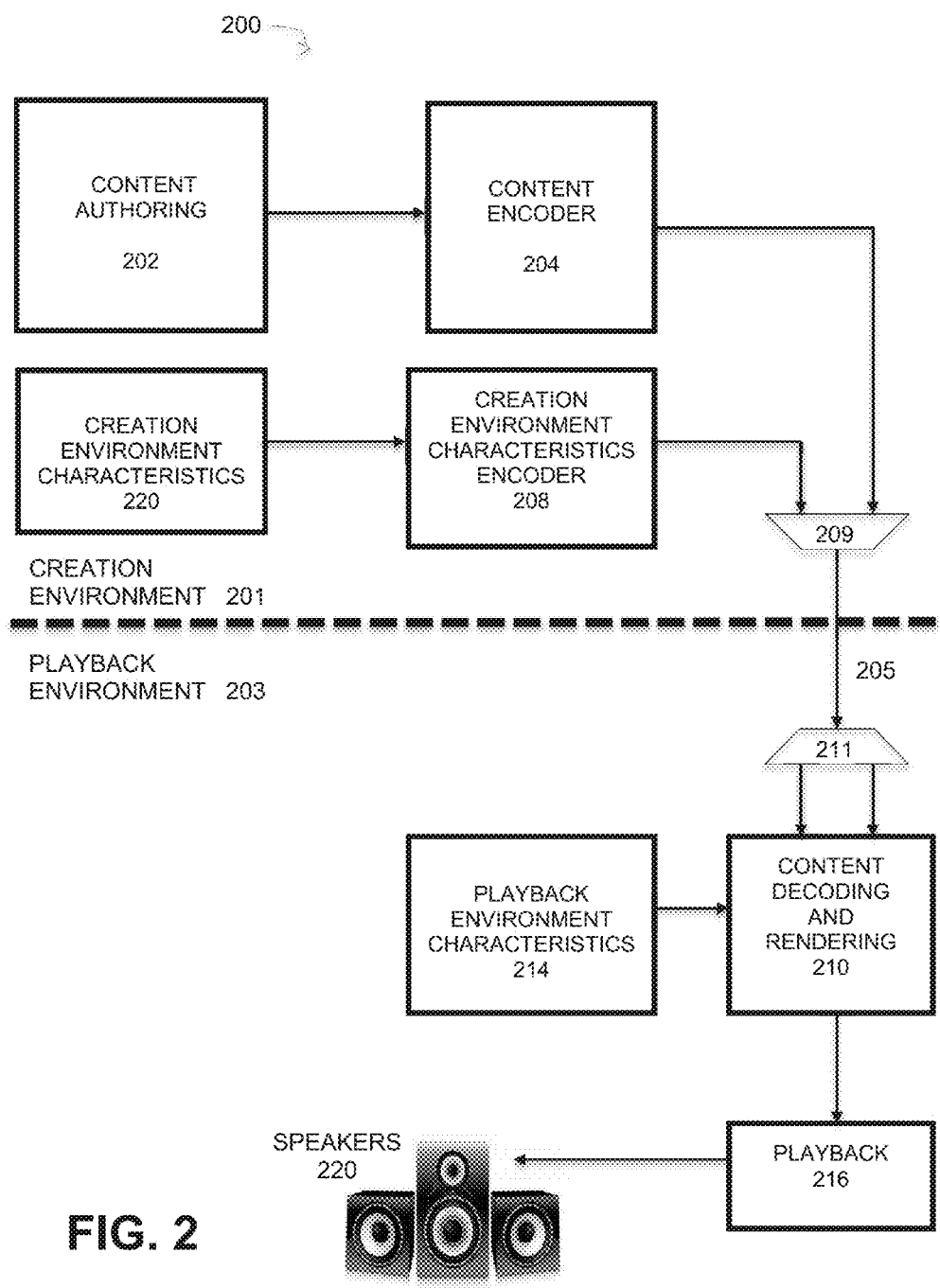
FIG. 2 illustrates an audio creation, rendering, and playback system that incorporates a creation environment target frequency response encoding and decoding scheme, under some embodiments.

FIG. 2 illustrates an audio creation, rendering, and playback system that incorporates a creation environment target frequency response encoding and decoding scheme, under some embodiments. As shown in system 200 of FIG. 2, audio content is created (i.e., authored or produced) and encoded for transmission in a creation environment 201 for transmission to a playback environment 203. For an embodiment in which the audio content is cinema sound, the creation environment may include a cinema content authoring station or component 202 and a cinema content encoding component (content encoder) 204 that encodes, conditions or otherwise processes the authored content for transmission to the playback environment 203. The cinema content authoring station 202 may comprise certain cinema authoring tools that allow a producer to create and/or capture audio/visual (AV) content comprising both sound and video content. The content authoring component 202 may thus be used in conjunction with an audio source and/or authoring tools to create audio content, or an interface that receives pre-produced audio content. The audio content may include monophonic, stereo, channel-based or object-based sound. The sound content may be analog or digital and may include or incorporate any type of audio data such as music, dialog, noise, ambience, effects, and the like. The authored content generated by component 202 is encoded for transmission by the content encoder 204. This component may comprise any number of appropriate sub-components, such as A/D (analog to digital) converters, translators, codecs, interfaces, sound processors, and so on. The creation environment may also include other components such as sound mixing consoles, verification components or any other appropriate sound generation or processing system. The encoded cinema content is packaged as a digital audio signal comprising an encoded bitstream that is transmitted over a transmission link 205 to the playback environment 203. The link 205 may comprise a direct connection, short or long-distance network link, Internet connection, wireless transmission link, or any other appropriate transmission link for transmitting digital data from the creation environment 201 to the playback environment 203.

In an embodiment, the creation environment 201 may represent an authoring room or mixing booth that is a closed and acoustically balanced environment, although any creation environment is possible. The creation environment has certain audio characteristics 220 that impart a certain response to the authored content 202. This set of characteristics generally informs the way that the sound creator or engineer hears the sound during creation, and may lead that person to add certain effects to tailor the sound in a certain way. This creates a creation environment response curve that is possibly unique to the particular creation environment when the content was authored. Along with any additional effects or equalization applied to the content, these environment characteristics create a target response curve that should be utilized by the playback system so that the audio that is heard by the audience in the playback environment 203 matches what the creator "heard" when the content was authored or engineered. For example, if the creation environment is a relatively small environment with limited bass response, but the playback environment is a big cinema with heavy bass response, straight playback of the content may result in an audio that has too much low end (boomy) compared to what the author intended. In an embodiment, a creation environment encoder and decoder system are used to provide input to a calibration/tuning module that modifies the played back content so that it more closely matches the creation environment (target) transfer characteristics. In the above example, the bass would be attenuated in the cinema according to the target transfer function so that the audio would be played back with respect to frequency response at the same level as it was created in the creation environment.

For the embodiment of FIG. 2, the creation environment characteristics 220, which may comprise characteristics such as frequency response across the audio range including resonances, flat spots, and so on, are encoded by the creation environment characteristics encoder 208. This creates an encoded version of the target transfer curve that represents the creation environment characteristics 220. The output from encoder 208 is combined with the encoded content in a multiplexer 209, or other similar combinatorial circuit for transmission over data link 205.

As stated above, the playback environment 203 typically comprises a movie theatre or similar venue for playback of a movie and associated audio (cinema content) to an audience. The encoded cinema content and encoded creation environment characteristics transmitted over link 205 is in a de-multiplexer 211 for separation into the constituent content and target transfer curve signals. These signals are received by a content decoding and rendering component 210, which decodes the encoded cinema content and renders the audio for playback 216 through speakers 220 in the cinema listening environment. The playback stage may include one or more amplifier, buffer, or sound processing components that amplify and process the audio for playback through speakers 220. The speakers may comprise single speakers or an array of speakers, such as a surround-sound array or immersive audio speaker array. For a typical playback environment, the decoding and rendering component 210 may be embodied as a playback console or control unit within a control booth or projection room of a cinema, and the cinema playback environment 203 may comprise the theatre or audience seating portion of the cinema. The decoding and rendering component 210 may comprise any number of appropriate sub-components, such as D/A (digital to analog) converters, translators, codecs, interfaces, amplifiers, filters, sound processors, and so on.

As shown in system 200, the content decoding and rendering component 210 receives the audio content, the target transfer curve as well as inherent playback environment characteristics 214, which represents the frequency response of the playback environment 203 and produces a playback transfer curve that is likely different (perhaps significantly different) from the target transfer curve. Certain comparator and equalization/sound processing circuits in the decoding and rendering stage 210 apply a correction to the received audio content so that playback environment characteristics more closely match the target transfer curve transmitted from the encoder 208.

The equalization method and system for matching program playback environment to the program creation (or validation) environment allows the content creator to define a system transfer function (also referred to as the "target transfer curve" or "system transfer curve") that describes the relationship between the delivered audio signal or other defined signal, and the in-room (listening environment) sound during the content creation process. The target transfer curve is then delivered to the playback system and the appropriate equalization settings are applied to the received signal for rendering in the listening environment. The application of the target transfer curve helps ensure that the rendered audio matches, as closely as possible, the audio content as intended to be heard by the content creator. In general, the target transfer curve defined should match that of the final mix facility, but in practice would be left to the discretion of the studio or content creator.

For the embodiment of system 200, original cinema (or TV, Internet or other) content is captured and/or authored for playback in a playback environment 203 that has certain inherent playback environment characteristics 214 caused by design, configuration, and inherent acoustic characteristics. The listening environment may also be any other appropriate listening environment, such as a home cinema environment, classroom, car, outdoor venue, or any other similar listening environment. The output of the cinema authoring component 202 may consist of audio objects, audio channels and metadata that convey the artistic intent of the sound author or mixer (content creator). Modules appropriate for delivering cinema content can be fed into one or more distribution pipelines making up link 205 for delivery to one or more consumer end points such as a cinema or home theater. For example, immersive audio cinema content may be encoded using a codec suitable for broadcast purposes such as Dolby Digital Plus, which may be modified to convey channels, objects and associated metadata, and is transmitted through the distribution chain via terrestrial broadcast, cable or satellite and then decoded and rendered in the consumers home for home theater or television playback. Similarly, the same content could be encoded using a codec suitable for online distribution where bandwidth is limited, where it is then transmitted through a 3G or 4G mobile network and then decoded and rendered for playback via a mobile device using headphones. Other content sources such as TV, live broadcast, games and music may also use the immersive audio format to create and provide content for next generation cinema or consumer audio formats.

In an embodiment, the encoders 204 and 208 along with decoder 210 comprises a target transfer curve matching system that reproduces a high fidelity audio program, where "fidelity" means that the program upon reproduction in the playback environment 203 is well matched to the program that was heard and approved by the program creator in the creation environment 201. As stated previously, this is currently achieved in cinema applications by using the SMPTE ST 202 equalization curve, and SMPTE RP 200 level alignment. However, this industry-standard curve is not adaptive to sound characteristics tailored to the creation and/or validation environment 201 and does not adequately accommodate playback for consumer applications (e.g., movies, TV, streaming digital content). The target transfer curve matching system provides a method for consistently matching program playback environment to the creation/monitoring/validation environment that would meet the certain requirements and provide certain benefits. First, the method provides backward compatibility in that the distribution and playback equipment can support programs made using current and past standards and practices. Second, it provides forward compatibility in that the authoring, distribution and playback equipment can support programs using as yet unspecified or future standards. Third, it provides flexibility in that the authoring, distribution and playback equipment can support customized, arbitrary or experimental B-chain responses as chosen by content creators.

The target transfer function is generally defined by the content creator who may be the sound mixer, sound engineer, content author, producer, or any other person who decides how the audio program should sound when played back. The creator can tune the mix stage during the cinema content authoring stage the way that they like to hear it based on certain criteria. For example, the creator may want it the sound to have a flat frequency response, or may want it to accentuate certain frequencies, e.g., enhanced or cut bass, mid-range, or treble; or they could tune it so that it sounds empirically or subjectively "right." To do this they may adjust system equalization gains through graphical or parametric EQ controls, for example, until the desired playback quality is achieved. Alternatively, the creator could use a standard or pre-defined response curve (e.g., the SMPTE X-Curve). Alternatively, the creator could use start with a standard or pre-defined response curve (e.g., the SMPTE X-Curve) and modify it based on subjective or objective adjustments to achieve a desired response. Alternatively, the creator could define a response that they believe will give best results in a playback environment 203, where the defined response does not necessarily match that of the creation environment. For example, a mixing engineer working in a particular mix environment, such as a small edit room, may be mixing for playback in a large cinema, and know from experience the best target response for translation or adaptation to the large cinema playback environment.

In an embodiment, desired response curve is based on the audio characteristics of the creation environment 220, such as the acoustic characteristics of the mix room, for example. For this embodiment, the target transfer function is selected and configured so that frequency response of the playback audio in the cinema listening environment 203 matches that of the creation environment (final mix facility) 201, so that effectively the playback environment characteristics match the creation environment characteristics 220 through correction or tuning of the received audio content. For this embodiment, the inherent response of the creation environment (room) is measured. Differential gains based on the inherent response are then applied to a base or initial transfer function (e.g., a flat response curve or a standard SMPTE X-Curve). Alternatively, the net response of the creation environment (inherent environment response plus any applied changes) is measured. In this way, matching the target transfer curve requires measuring the inherent response of the room and applying the differential gains required to hit the target.

In an embodiment, the encoder 208 determines the inherent response of the creation environment room 201, and determines the differential gains to be applied to the audio signal to derive the target system transfer curve. This comprises a net room response that consists of the inherent response plus any applied electronic EQ or other effects added by the creator or engineer. This response is then encoded and transmitted to the multiplexer 209 for combination with the encoded audio to be transmitted together over link 205.

In an embodiment, the target transfer curve is described in terms of the overall playback level, and a frequency-dependent power response function. For digital program distribution, the transfer function can be carried as metadata. The metadata can comprise a mix level (mixLevel) parameter that is a single value representing a measure of the reference acoustic level in response to a defined stimulus audio signal. The stimulus audio signal may be a broadband signal, pink noise or a tone sweep, or other similar signal, at a defined electrical or digital level. The sound level may be expressed as C-weighted sound pressure level (SPL), in dB, or any other similar value.

Example metadata encoding a transfer function using a mixLevel parameter is as follows:

```
mixLevel
    targetEQExists
    if(targetEQExists = = 1 {
    /* Indicate EQ */
    NumEQPoints
    for(n = 0; n < NumEQPoints; n++) {
    targetEQFreq[n]
    targetEQSlope[n]
    }
    else (targetEQExists = = 0) {
    use default (e.g. flat)
    }
```

The above programming code segment is intended to be an example segment and many other implementations are also possible including different instructions, programming structures, languages, and so on, depending on system and/or platform configurations.

Figure 3A:
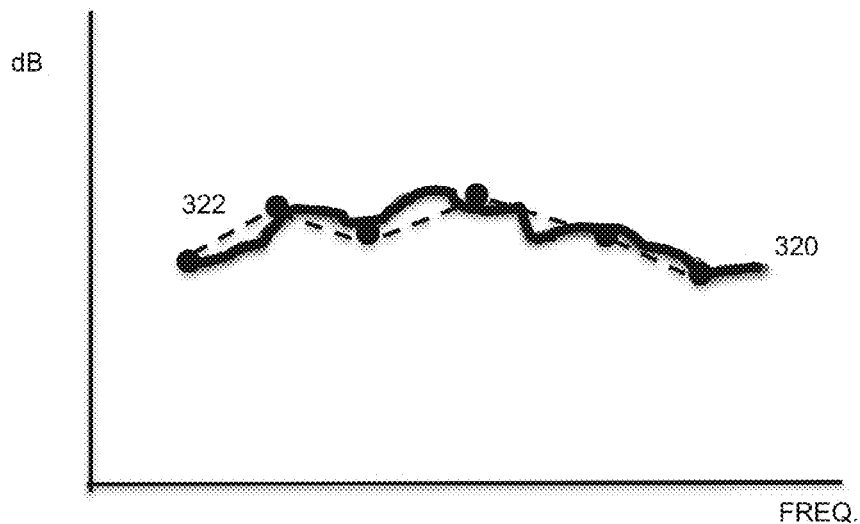
FIG. 3A illustrates an example target transfer curve, under an embodiment.

In an embodiment, the target transfer curve is encoded as a piece-wise linear (PWL) representation of the frequency response curve of the creation environment. FIG. 3A illustrates an example target transfer curve, under an embodiment. The graph of level (dB) versus frequency for an actual frequency response curve 320 is approximated by a series of segments 322 defined by endpoints and slopes between the endpoints to produce a PWL approximation of the actual frequency response curve 320. This represents the target transfer curve that is used by the decoder to tune or correct the received audio so that the playback environment characteristics can effectively more closely match the creation environment characteristics.

Figure 3B:
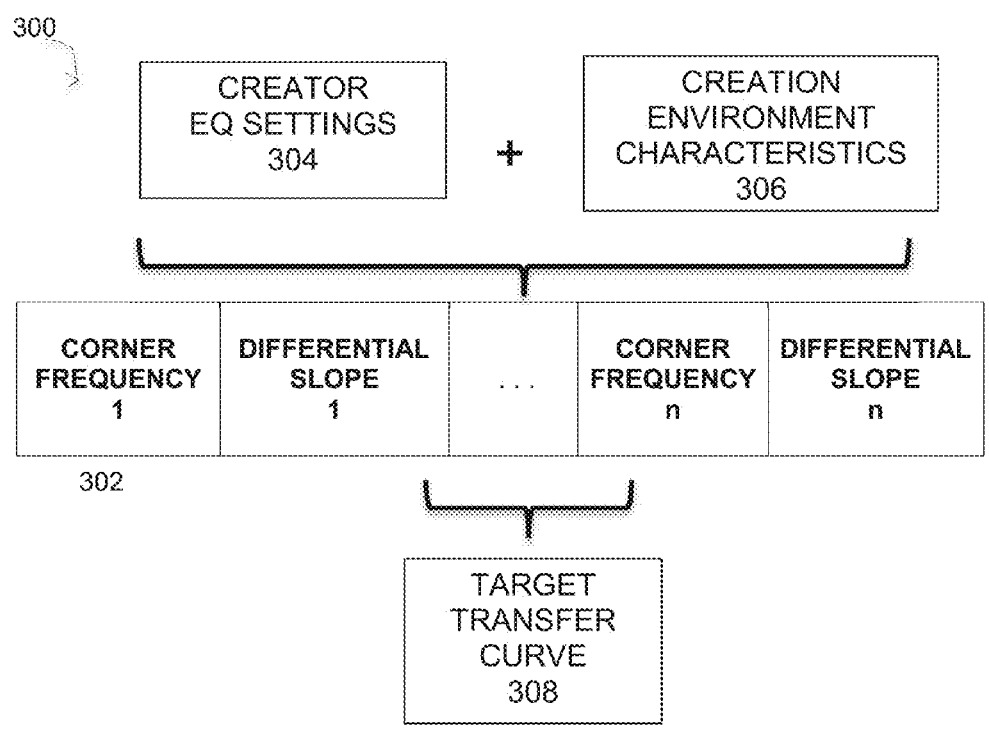
FIG. 3B illustrates the composition of metadata encoding the transfer function data that is transmitted as the encoded target transfer curve under some embodiments.

FIG. 3B illustrates the composition of metadata encoding the transfer function data that is transmitted as the encoded target transfer curve under some embodiments. As stated earlier, the target transfer curve may comprise a inherent room response in combination with any EQ or effects added by the creator. Thus, as shown in diagram 300, the creation environment characteristics 306 combined with any added creator EQ settings 304 makes up the target transfer curve 308. As further shown in diagram 300, the target transfer curve data 302 (which may correspond to the PWL approximated curve 322 in FIG. 3A) is provided in data element (datum) pairs, where one data element is the corner frequency, and the second is the differential slope. For example, the standard X-Curve, defined as follows: 3 dB roll-off below 50 Hz, flat from 50 Hz to 2 kHz, 3 dB roll-off from 2 kHz to 10 kHz, and 6 dB roll-off above 10 kHz, is specified with the following [corner frequency, differential slope] pairs: [0 Hz, 3 dB], [50 Hz, -3 dB], [2 kHz, -3 dB], [10 kHz, -3 dB]. As shown in FIG. 3B, any number N of response segments can be defined for a transfer curve with corner frequency/differential slope pairs provided for each segment n from 1 to N.

The PWL values 302 of FIG. 3B may define a transfer curve, or they may represent modifications to a defined transfer curve, such as the SMPTE X-Curve. In this case, the differential slope values may be read as adjustments to standard defined slopes for certain frequency ranges defined by successive corner frequencies. In either case, the PWL values represent a response curve corresponding to a desired response based on the audio characteristics of the creation environment, such that the EQ settings 304 applied to the creation environment characteristics 306 comprise the target transfer curve 308 that creates the desired acoustic response when the audio program is played back in the cinema environment.

Figures 3C, 4:
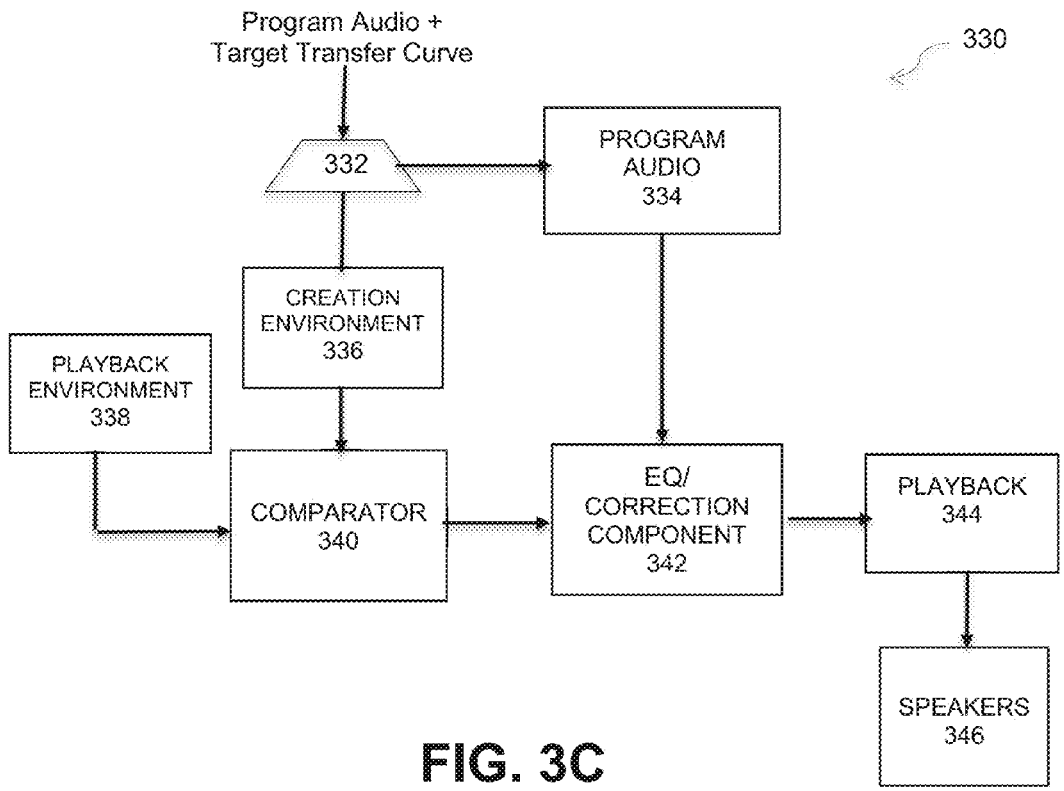
FIG. 3C illustrates a decoder stage that includes comparator and EQ functions to perform the transfer curve matching, under an embodiment.
FIG. 4 is a table listing certain parameters associated with the system transfer function under some embodiments.

As shown in FIG. 2, at the decode or playback side 203, the target transfer curve information 308 is extracted by the decoder 210 after it is separated out from the program content by the de-multiplexer 211, and provides the basis for a comparison and equalization process that tunes the audio program so that the frequency response of the audio as it is played back matches the target transfer curve. FIG. 3C illustrates a decoder stage that includes comparator and EQ functions to perform the transfer curve matching, under an embodiment. As shown in diagram 330, which corresponds to the decoder side 203 of FIG. 2, the combined audio and target transfer curve is input to de-multiplexer 332, which splits the program audio 334 from the creation room characteristics as encoded in the target transfer curve. The characteristics of the playback environment 338 are derived and input to a comparator 340. In an embodiment, the playback environment characteristics 338 may be obtained through frequency response measurements taken of the cinema (or other playback environment) and encoded as a frequency response curve. The playback environment characteristics 338 are then compared in comparator 340 to the creation environment characteristics 336 as embodied in the target transfer curve. The comparator generates a difference value between the creation environment frequency response and the playback environment frequency response. This data is then provided to an EQ/correction component 342 that performs certain equalization and other relevant corrections, such as phase and/or signal level modification to tune the program audio 334 in a way that reproduces the program audio according to the creation environment characteristics 336. In general, the EQ function performed by component 342 alters the frequency response of the playback environment by applying a set of gains to the program audio 334 within defined frequency bands. These gain values represent EQ settings that are applied during the playback stage 344 so that the net system response of the playback environment matches the target transfer curve embodying the creation environment frequency response. The equalized or corrected signal is then sent from playback stage 344 to speakers 346.

In an embodiment, the creation environment frequency response curves and the playback environment frequency response may be derived and encoded by comparing the respective response curves to a flat (reference curve) and deriving differences, so that the difference equals the measured response minus the reference response (flat). This difference can then be encoded and processed by the comparator to derive the correction settings. Alternatively, the creation and playback environment frequency responses may be derived by explicit measurement of the signal at each selected frequency response and encoded accordingly. The resolution of the frequency response curves and data sets, as exemplified in FIG. 3A can be set by the content creator so that either fine, coarse or medium granularity with regard to the points of comparison are used to compare and tune the playback environment frequency response curve.

In general, the matched audio characteristics between the creation and playback environments comprises the frequency response and overall sound pressure level of the audio content, as represented by the equalization settings 302 of the system transfer curve. Other parameters may also be included as part of the overall transfer curve and may be additionally encoded as metadata elements that are transmitted as part of the transfer curve. FIG. 4 is a table listing certain parameters associated with the system transfer function under some embodiments. As shown in table 400, a max+gain and min-gain value represent the maximum/minimum value or values that should be applied to the creation environment room response to meet the creation environment characteristics embodied in the target transfer curve. A frequency range of interest parameter can be used to specify or limit the overall frequency range to apply the transfer curve (e.g., the audible frequency range), so that gains are not applied above or below the specified range (e.g., below 20 Hz or above 20 KHz).

A degree of smoothing may be applied to the room response measurement prior to computing gains needed to hit the target response. More smoothing with respect to frequency will remove the smaller "wiggles" in the measured response, that is, wiggles that need not be corrected and should be ignored. In some cases, too much smoothing will remove important frequency variation, so the smoothing parameter allows this characteristic to be individually set. Commonly used degrees of smoothing include: 1 octave, ⅓ octave (most common), ⅙ octave, and 1/12 octave smoothing. A tolerance parameter may be provided to define plus/minus frequency response tolerances as a function of frequency. This allows the setting of a minimum amount of "matching" between the creation and playback environments.

Figure 5:
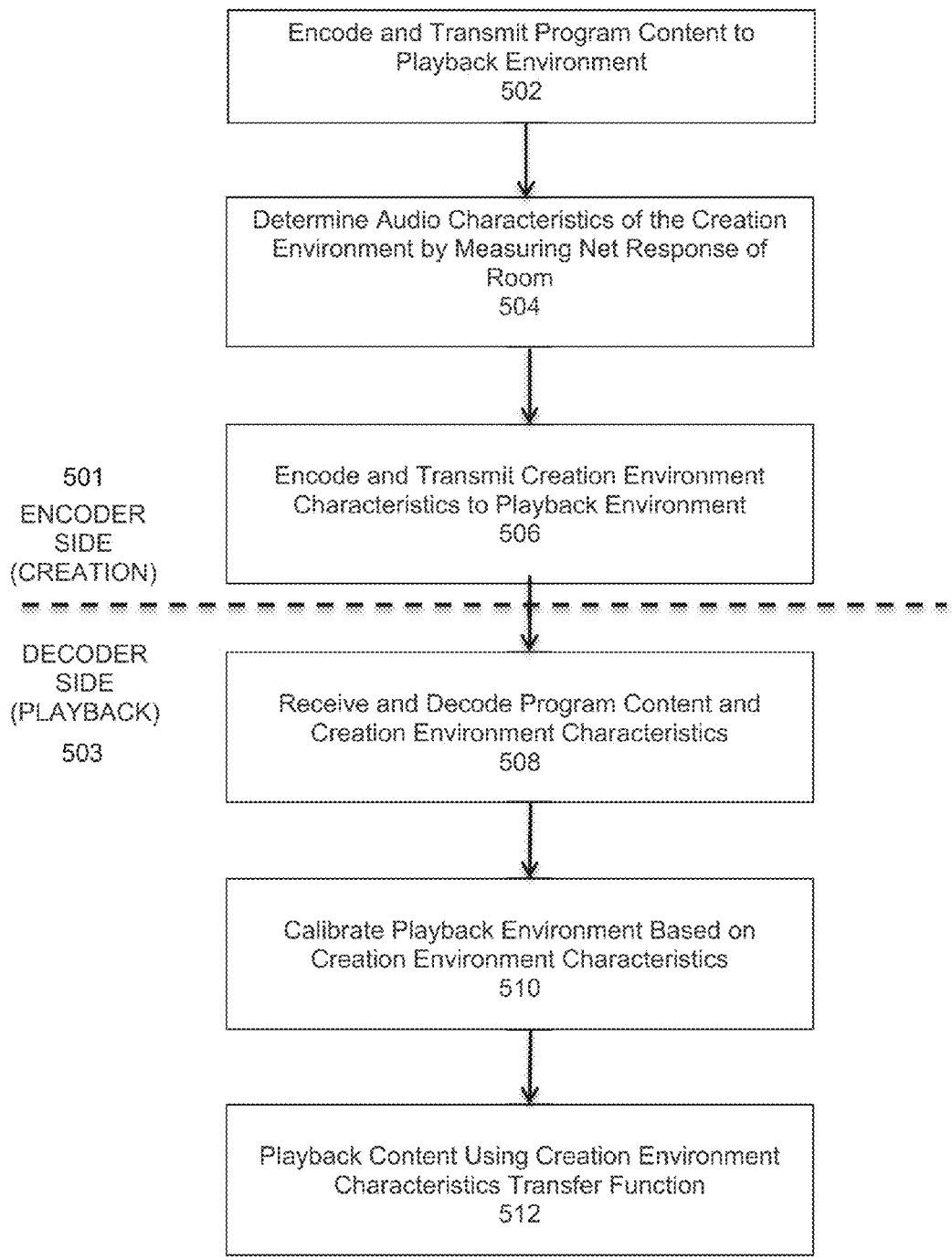
FIG. 5 is a flowchart illustrating a method of matching audio characteristics between a creation environment and a playback environment under some embodiments.

FIG. 5 is a flowchart illustrating a method of matching audio characteristics between a creation environment and a playback environment under some embodiments. The flowchart of FIG. 5 illustrates a process of matching the transfer function of the playback environment to that of the creation environment, such as the final mix facility so that the play back sound matches the sound desired by the mixing engineer (or other creator).

As shown in FIG. 5, the overall method includes certain processing steps performed by one or more encoder components in the encoder or creation side 501, and certain other processing steps performed by one or more decoder components in the decoder or playback side 503. The overall method begins with the encoding and transmission of audio program content to the playback environment, 502. The encoder determines the audio characteristics of the creation by measuring the net response of the room, 504. The net response comprises the target transfer curve that may embody the frequency response curve of the room plus any EQ or effects added by the creator. The encoder then encodes and transmits the creation environment characteristics as embodied in the target transfer curve to the playback environment, 506. On the playback side 503, the decoder receives and decodes the program content and the creation environment characteristics, 508. It then calibrates the playback environment based on the target transfer curve data embodying the creation environment characteristics, 510. The playback stage then plays the content through the speakers using the target transfer curve, 512.

In an embodiment, creating the target transfer curve requires measuring the inherent response of the creation environment room to determine the audio characteristics of the creation environment, 502. The net response is then determined such as by the mixing engineer applying various EQ settings until the sound is subjectively or objectively right or desirable. The target transfer curve data yields a set of differential gains required to hit this desired net response. The differential gains comprise EQ settings that, along with the inherent response are encoded as the target transfer curve for transmission to the playback decoder. Upon receipt in the playback side, the decoder decodes and applies the differential gains required to recreate the target response for the audio content rendered in the playback environment. The target transfer curve may be modified and/or applied differentially depending on the application and use case. For example, in an embodiment, the same target transfer curve applies to the entire program and all reproduction devices (loudspeakers) used during playback. Alternatively, one or more target transfer curves could be delivered with the program for specific reproduction devices (e.g., frontal/screen loudspeakers versus lateral and rear/surround loudspeakers). Such embodiments are described in greater detail with reference to FIG. 6 below. Alternatively, one or more target transfer functions could be delivered with the program for specific program elements (e.g., dialog versus music, or LFE channel versus center channel, etc.).

In a further alternative embodiment, a finite set of pre-defined transfer functions could be defined ("presets"), and the program would carry an indication of which preset to use.

Although embodiments have been described with respect to digital audio signals and program transmission using digital bitstreams, it should be noted that the audio content and associated transfer function information may instead comprise analog signals. In this case, the transfer function can be encoded and defined, or a transfer function preset selected, using analog signals such as tones. Alternatively, for analog or digital programs, the target transfer function could be described using an audio signal; for example, a signal with flat frequency response (e.g. a tone sweep or pink noise) could be processed using a pre-emphasis filter so as to give a flat response when the desired transfer function (acting as a de-emphasis filter) is applied.

Furthermore, although embodiments have been primarily described in relation to content and distribution for cinema (movie) applications, it should be noted that embodiments are not so limited. The playback environment may be a cinema or any other appropriate listening environment for any type of audio content, such as a home, room, car, small auditorium, outdoor venue, and so on.

The created content may be provided in various different formats including cinema, TV, live broadcast (and sound), UGC (user generated content), games and music. The content as it passes through the ecosystem, goes through several key phases, such as pre-processing and authoring tools, translation tools (i.e., translation of immersive audio content for cinema to consumer content distribution applications), specific immersive audio packaging/bit-stream encoding (which captures audio essence data as well as additional metadata and audio reproduction information), distribution encoding using existing or new codecs (e.g., DD+, TrueHD, Dolby Pulse) for efficient distribution through various consumer audio channels, transmission through the relevant consumer distribution channels (e.g., terrestrial broadcast, disc, mobile, Internet, etc.). A dynamic rendering component may be used to reproduce and convey the immersive audio user experience defined by the content creator that provides the benefits of the spatial audio experience. The rendering component may be configured to render audio for a wide variety of cinema and/or consumer listening environments, and the rendering technique that is applied can be optimized depending on the end-point device. For example, home theater systems and soundbars may have 2, 3, 5, 7 or even 9 separate speakers in various locations. Many other types of systems have only two speakers (e.g., TV, laptop, music dock) and nearly all commonly used devices have a headphone output (e.g., PC, laptop, tablet, cell phone, music player, etc.).

In an embodiment, the audio processed by the system may comprise monophonic (single channel) audio, stereo (two-channel) audio, or even channel-based audio, object-based audio, or object and channel-based audio (e.g., hybrid or adaptive audio) that may be referred to as "immersive audio." In the case of object or immersive audio, the audio comprises or is associated with metadata that dictates how the audio is rendered for playback on specific endpoint devices and listening environments. Channel-based audio generally refers to an audio signal plus metadata in which the position is coded as a channel identifier, where the audio is formatted for playback through a pre-defined set of speaker zones with associated nominal surround-sound locations, e.g., 5.1, 7.1, and so on; and object-based means one or more audio channels with a parametric source description, such as apparent source position (e.g., 3D coordinates), apparent source width, etc. The term "immersive audio" may be used to mean channel-based and/or object-based audio signals plus metadata that renders the audio signals based on the playback environment using an audio stream plus metadata in which the position is coded as a 3D position in space. In general, the listening environment may be any open, partially enclosed, or fully enclosed area, such as a room, but embodiments may also include playback through headphones or other close proximity endpoint devices. Audio objects can be considered as groups of sound elements that may be perceived to emanate from a particular physical location or locations in the environment, and such objects can be static or dynamic. The audio objects are controlled by metadata, which among other things, details the position of the sound at a given point in time, and upon playback they are rendered according to the positional metadata. In a hybrid audio system, channel-based content (e.g., 'beds') may be processed in addition to audio objects, where beds are effectively channel-based sub-mixes or stems. These can be delivered for final playback (rendering) and can be created in different channel-based configurations such as 5.1, 7.1, and so on.

Figure 6:
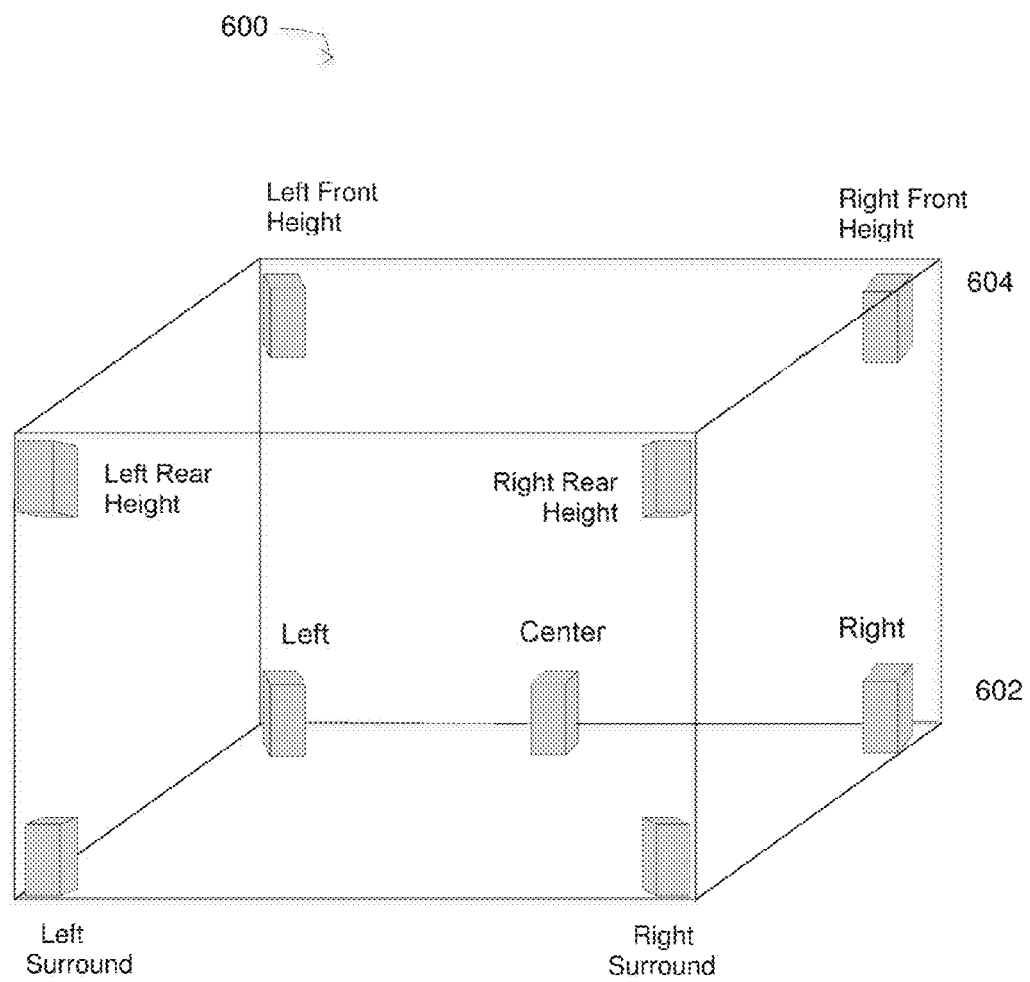
FIG. 6 illustrates an example speaker placement in a surround system (e.g., 9.1 surround) that may be used with embodiments of a cinema equalization scheme under some embodiments.

An example implementation of an immersive audio system and associated audio format is the Dolby® Atmos™ platform for use in cinema applications. Such a system incorporates a height (up/down) dimension that may be implemented as a 9.1 surround system, or similar surround sound configuration. FIG. 6 illustrates the speaker placement in a present surround system (e.g., 9.1 surround) that provides height speakers for playback of height channels. The speaker configuration of the 9.1 system 600 is composed of five speakers 602 in the floor plane and four speakers 604 in the height plane. In general, these speakers may be used to produce sound that is designed to emanate from any position more or less accurately within the room. Predefined speaker configurations, such as those shown in FIG. 6, can naturally limit the ability to accurately represent the position of a given sound source. For example, a sound source cannot be panned further left than the left speaker itself. This applies to every speaker, therefore forming a one-dimensional (e.g., left-right), two-dimensional (e.g., front-back), or three-dimensional (e.g., left-right, front-back, up-down) geometric shape, in which the downmix is constrained. Various different speaker configurations and types may be used in such a speaker configuration. For example, certain enhanced audio systems may use speakers in a 9.1, 11.1, 13.1, 19.4, or other configuration. The speaker types may include full range direct speakers, speaker arrays, surround speakers, subwoofers, tweeters, and other types of speakers. As stated above, the same or different system transfer functions may be applied to different speakers or sets of speakers within a channel/object-based surround sound system, such as system 600 of FIG. 6.

Aspects of the methods and systems described herein may be implemented in an appropriate computer-based sound processing network environment for processing digital or digitized audio files. Portions of the immersive audio system may include one or more networks that comprise any desired number of individual machines, including one or more routers (not shown) that serve to buffer and route the data transmitted among the computers. Such a network may be built on various different network protocols, and may be the Internet, a Wide Area Network (WAN), a Local Area Network (LAN), or any combination thereof. In an embodiment in which the network comprises the Internet, one or more machines may be configured to access the Internet through web browser programs.

One or more of the components, blocks, processes or other functional components may be implemented through a computer program that controls execution of a processor-based computing device of the system. It should also be noted that the various functions disclosed herein may be described using any number of combinations of hardware, firmware, and/or as data and/or instructions embodied in various machine-readable or computer-readable media, in terms of their behavioral, register transfer, logic component, and/or other characteristics. Computer-readable media in which such formatted data and/or instructions may be embodied include, but are not limited to, physical (non-transitory), non-volatile storage media in various forms, such as optical, magnetic or semiconductor storage media.

Embodiments are further directed to systems and articles of manufacture that perform or embody processing commands that perform or implement the above-described method acts, such as those illustrated in the flowchart of FIG. 5.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method of rendering an audio program, comprising:
    receiving, in a renderer of a playback system, the audio program, wherein the audio program is associated with a creation environment transfer curve representing frequency response characteristics of the creation environment;
    deriving a playback environment response based on frequency response characteristics of a playback environment for the audio program;
    comparing the creation environment transfer curve to the playback environment response to generate a set of correction settings; and
    applying the correction settings to the audio program so that the audio program is rendered according to the frequency response characteristics of the creation environment.

2. The method of claim 1 wherein the creation environment transfer curve represents a frequency response and overall sound pressure level corresponding to a desired sound of the audio program by a creator of the audio program.

3. The method of claim 2 wherein the audio program comprises digital audio content transmitted to the renderer as a digital bitstream, and wherein the transfer function is transmitted as metadata encoded in the digital bitstream.

4. The method of claim 2 wherein the correction settings comprise differential gain values applied to the audio program to compensate for differences between desired characteristics of the playback environment and the playback environment response.

5. The method of claim 4 wherein the creation environment transfer curve is represented as a transfer curve comprising a series of frequency response segments comprising data pairs specifying a corner frequency and differential slope.

6. The method of claim 5 wherein the transfer curve further comprises one or more parameters selected from the group consisting of: frequency range of interest, maximum/minimum gain values, match tolerance values, and smoothing factors applied to the inherent response.

7. The method of claim 4 wherein the desired characteristics of the playback environment comprises at least one of an objective measure based on a standard frequency response characteristic and a subjective measure based on judgment by the creator of the audio program.

8. The method of claim 7 wherein the audio program comprises cinema content including audio tracks, the playback environment comprises a cinema, and the creation environment comprises one of a mixing facility or a content authoring facility, and further wherein the creator comprises one of a mixing engineer, an audio engineer, or a program author.

9. A method for reproducing an audio program, comprising:
   receiving, in a playback system an audio program associated with a creation environment transfer curve representing frequency response characteristics of the creation environment as defined during creation of the audio program in a transfer function; and
   decoding the transfer function to obtain equalization data to be applied by the playback system to reproduce the audio program according to the frequency response characteristics of the creation environment, wherein the equalization data compensates for different audio characteristics of the playback system and listening environment relative to desired characteristics of a playback environment for the audio program.

10. The method of claim 9 wherein the transfer function comprises a function of overall playback level and frequency-dependent power response function.

11. The method of claim 10 wherein the audio program comprises digital audio content and the transfer function is carried as metadata associated with the audio program during delivery to the playback system.

12. The method of claim 11 wherein the transfer function comprises a single value mix level parameter representing a measure of a reference acoustic level in response to a defined stimulus audio signal.

13. The method of claim 12 wherein the stimulus audio signal comprises one of: a broadband signal, pink noise, and a tone sweep signal, wherein the reference acoustic level is expressed as a C-weighted sound pressure level (SPL) in decibel units.

14. The method of claim 9 wherein the equalization data comprises corner frequency pairs and differential slope data to define a system target response curve shown as a graphical plot of frequency in hertz versus playback SPL in decibels for the transfer function.

15. The method of claim 14 wherein the playback environment comprises a cinema, and wherein the frequency response curve comprises a modified SMPTE ST 202 standard curve (X-curve).

16. The method of claim 9 wherein the transfer function is applied to an entire audio program and all playback speakers during playback of the audio program.

17. The method of claim 9 wherein the transfer function is applied to an entire audio program and a subset of all playback speakers during playback of the audio program.

18. The method of claim 17 wherein the audio program comprises at least in part channel-based audio and the playback system comprises a surround-sound speaker system, and wherein the subset of all playback speakers comprises specific surround speakers of a surround sound speaker array.

19. A system for rendering an audio program, comprising:
   a renderer of a playback system receiving the audio program, wherein the audio program is associated with a creation environment transfer curve representing frequency response characteristics of the creation environment;
   a component deriving a playback environment transfer curve based on frequency response characteristics of the playback environment;
   a comparator comparing the creation environment transfer curve to the playback environment transfer curve to generate a set of correction settings; and
   a playback stage applying the correction settings to the audio program so that the audio program is rendered according to the frequency response characteristics of the creation environment.

* * * * *